(12) United States Patent
Loke et al.

(10) Patent No.: US 9,671,249 B2
(45) Date of Patent: Jun. 6, 2017

(54) SYSTEM AND METHOD FOR INCREMENTAL ENCODER LOSS DETECTION

(71) Applicant: ROCKWELL AUTOMATION TECHNOLOGIES, INC., Mayfield Heights, OH (US)

(72) Inventors: Clare Siew Ling Loke, Singapore (SG); John James Jenks, Cleveland, OH (US); Liew Boh Chuan, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 240 days.

(21) Appl. No.: 14/522,430

(22) Filed: Oct. 23, 2014

(65) Prior Publication Data
US 2016/0003885 A1    Jan. 7, 2016

(30) Foreign Application Priority Data
Jul. 4, 2014 (SG) .......................... 10201403879W

(51) Int. Cl.
*G01R 31/08* (2006.01)
*G01D 3/08* (2006.01)
*G01R 31/02* (2006.01)

(52) U.S. Cl.
CPC ............. *G01D 3/08* (2013.01); *G01R 31/026* (2013.01)

(58) Field of Classification Search
CPC ........ H04B 3/46; G01R 31/02; G01R 31/021; G01R 31/04; G01R 31/08
USPC .................................................. 324/539–544
See application file for complete search history.

(56) References Cited

U.S. PATENT DOCUMENTS

| | | | | |
|---|---|---|---|---|
| 3,705,339 A | * | 12/1972 | Rhoades | G05B 19/182 318/39 |
| 5,287,107 A | * | 2/1994 | Gampell | H03M 3/368 341/110 |
| 5,570,010 A | * | 10/1996 | Jin | G01R 15/16 324/67 |
| 2008/0087091 A1 | * | 4/2008 | Shoureshi | G01N 29/223 73/602 |
| 2008/0231286 A1 | * | 9/2008 | Tsunekazu | G01R 31/024 324/509 |

(Continued)

*Primary Examiner* — Tung X Nguyen
*Assistant Examiner* — Robert P Alejnikov, Jr.
(74) *Attorney, Agent, or Firm* — Fletcher Yoder P.C.

(57) ABSTRACT

A system may include broken wire detector circuitry that may include an optocoupler, encoder isolator circuitry that may include input voltage protection circuitry, an optocoupler, and output filtering circuitry, and compensator circuitry that may include signal conditioning circuitry. The broken wire detector circuitry and the encoder isolator circuitry may be configured to accept inputs signals (A, B) and an index signal (Z) for a single-ended and differential type incremental encoder. The broken wire detector circuitry may be configured to convert an input AC pulse train signal to an analog DC signal. The encoder isolator may be configured to protect from high input voltages. And, the compensator may be configured to accept outputs of the broken wire detector circuitry and the encoder isolator circuitry and to integrate and dampen the analog DC signal that has a value representative of an operating state of the incremental encoder.

16 Claims, 7 Drawing Sheets

| | | 32 | 34 | 36 |
|---|---|---|---|---|
| | | BROKEN WIRE DETECTOR OUTPUT | ENCODER ISOLATOR | COMPENSATOR |
| 58 | NORMAL OPERATION | 1 | PULSE | DC VALUE + ATTENUATED RIPPLE |
| 60 | STALLING | 1 | 1 OR 0 | FIXED DC VALUE |
| 62 | BROKEN WIRE | 0 | 0 | 0 |

(56) References Cited

U.S. PATENT DOCUMENTS

2011/0309824 A1* 12/2011 Takahashi ............. F16C 41/007
  324/207.13
2013/0293251 A1* 11/2013 Martin ................ G06F 13/4247
  324/750.3

* cited by examiner

|  | BROKEN WIRE DETECTOR OUTPUT 32 | ENCODER ISOLATOR 34 | COMPENSATOR 36 |
|---|---|---|---|
| NORMAL OPERATION 58 | 1 | PULSE | DC VALUE + ATTENUATED RIPPLE |
| STALLING 60 | 1 | 1 OR 0 | FIXED DC VALUE |
| BROKEN WIRE 62 | 0 | 0 | 0 |

FIG. 2B

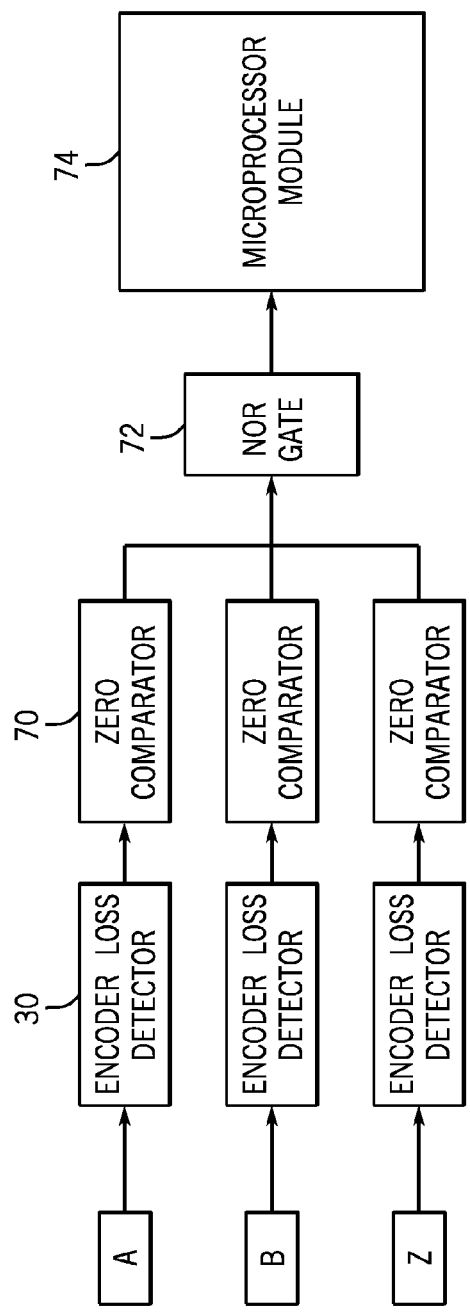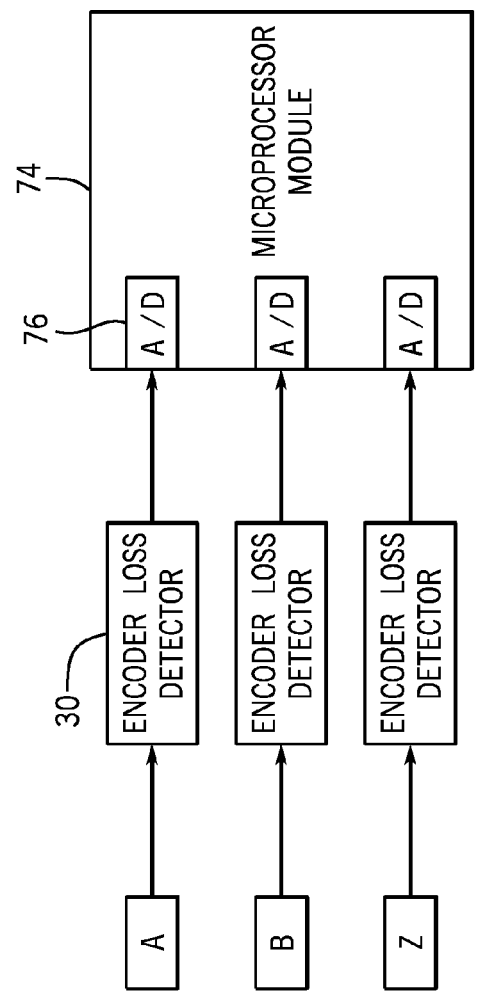

SYSTEM AND METHOD FOR INCREMENTAL ENCODER LOSS DETECTION

CROSS REFERENCE TO RELATED APPLICATIONS

This application claims the benefit of Singapore Application No. 10201403879W, filed on Jul. 4, 2014, entitled "System And Method For Incremental Encoder Loss Detection," which is herein incorporated by reference.

BACKGROUND

The present disclosure relates generally to encoders, and more specifically to systems and methods for incremental encoder loss detection.

Incremental encoders may be used to track linear or rotary motion (e.g., of a motor) and can be used to determine position and velocity (and higher level derivatives) of an encoder shaft. The output signals of incremental rotary encoders may incorporate two channels (e.g., A and B) to indicate rotation of the encoder shaft plus an optional zero or index marker pulse channel (e.g., Z). The A and B channels are typically in quadrature (90 degrees phase shift relative to each other), and they may be used to determine the direction of movement of the encoder shaft. The Z channel is typically a once per revolution pulse that may be used to indicate a home position relative to a single revolution of the encoder.

The loss of the encoder signal(s) due to a broken wire, cable detachment, or other type of signal loss may result in conditions in the attached motor being unknown or inaccurately known, which could reduce the performance of a motor drive. Typically, encoder loss detection schemes may only accurately detect A/B phase errors, but not broken wire scenarios where both quadrature inputs (e.g., A/B) go to the same state. Some detection schemes attempt to detect broken wires by measuring signal pairs to determine when they are no longer held in opposite logical states for a number of logic clock cycles, and ultimately setting an error bit. However, in such schemes, not only is there a delay before making a decision, but these methods typically use a field programmable gate array and/or firmware to aid in the analysis. Thus, the methods may have high component count and cost to implement, and may not even detect when a broken wire condition exists. Thus, it is now recognized that there exists a need for improved encoder loss detection.

BRIEF DESCRIPTION

Certain embodiments commensurate in scope with the originally claimed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

In accordance with one aspect of the present disclosure a system may include broken wire detector circuitry that may include an optocoupler, encoder isolator circuitry that may include input voltage protection circuitry, an optocoupler, and output filtering circuitry, and compensator circuitry that may include signal conditioning circuitry. The broken wire detector circuitry and the encoder isolator circuitry may be configured to accept inputs signals (A, B) and an index signal (Z) for a single-ended and differential type incremental encoder, the broken wire detector circuitry may be configured to convert an input AC pulse train signal to an analog DC signal, the encoder isolator may be configured to protect from high input voltages, and the compensator may be configured to accept outputs of the broken wire detector circuitry and the encoder isolator circuitry and to integrate and dampen the analog DC signal that has a value representative of an operating state of the incremental encoder.

In accordance with another aspect of the present disclosure a system may include encoder loss detector circuitry that may include a broken wire detector, an encoder isolator, and a compensator. The output signals from the broken wire detector and the encoder isolator may be input to the compensator, the broken wire detector may be configured to detect when there is a broken wire and convert an input pulse train signal to an analog DC signal with a value representative of the broken wire, the encoder isolator may be configured to protect from high input voltages and output a value representative of an operating state of an encoder, and the compensator may be configured to integrate and dampen the analog DC signal and output the dampened analog DC signal with a value representative of an operating state of the encoder.

In accordance with another aspect of the present disclosure a method may include receiving a pulse train signal from an incremental encoder at encoder loss detector circuitry that may include a broken wire detector, an encoder isolator, and a compensator, protecting, via the encoder isolator, the encoder loss detector circuitry from high input voltage, converting, via the broken wire detector, the pulse train signal to an analog DC signal, conditioning, via the compensator, the analog DC signal to be stable, outputting, via the compensator, the conditioned analog DC signal, and analyzing the conditioned analog DC signal.

DRAWINGS

These and other features, aspects, and advantages of the present disclosure will become better understood when the following detailed description is read with reference to the accompanying drawings in which like characters represent like parts throughout the drawings, wherein:

FIG. 2A is a circuit diagram of an exemplary encoder loss detector, while FIG. 2B represents an exemplary associated truth table, in accordance with aspects of the present disclosure;

FIGS. 3A and 3B are block diagrams of exemplary first and second embodiments, respectively, implementing the encoder loss detector of FIG. 2A, in accordance with aspects of the present disclosure;

DETAILED DESCRIPTION

Figure 1:
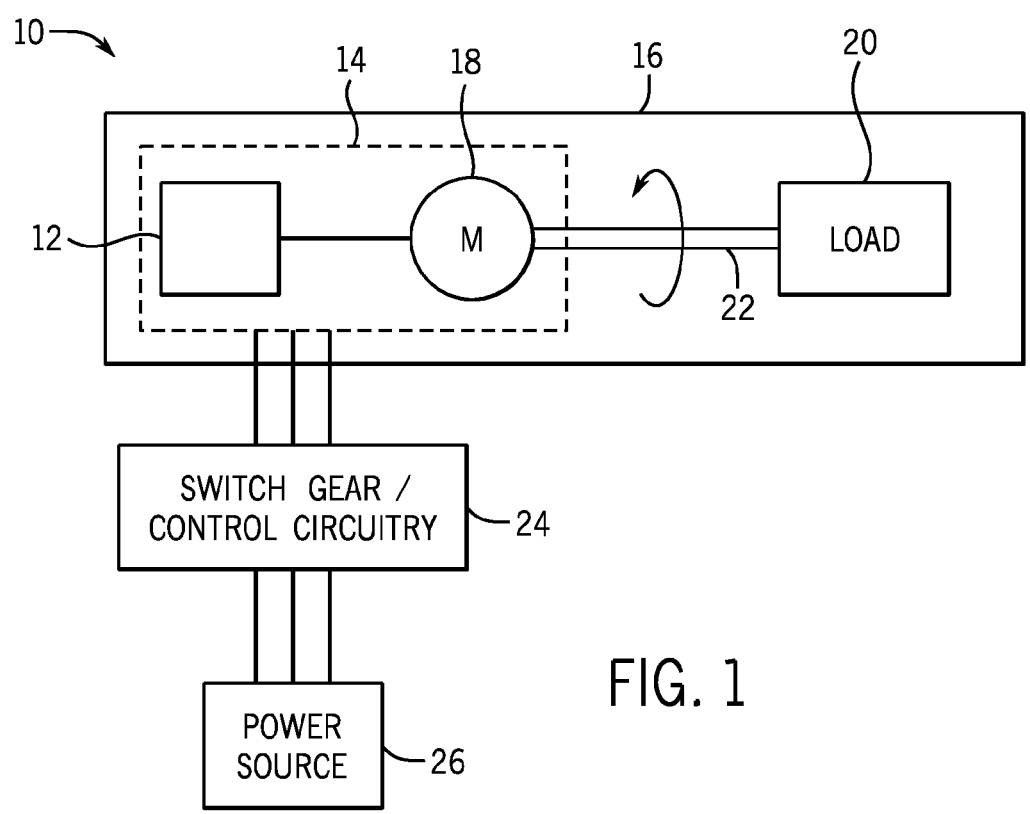
FIG. 1 is a schematic diagram of an embodiment of a system including an encoder, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Encoder loss detection used in connection with motor drives is important to determine certain operating states or modes of encoders, such as when there is a broken wire or the motor is stalling or changing speeds. However, as previously mentioned, some encoder loss detection schemes set phase error flags when A and B phases are not in quadrature. As a result, the schemes may not accurately detect when there is a broken wire due to the fact that both quadrature inputs go to the same state in such a situation. That is, the phase error flag will only be set if both inputs transition at the same time (e.g., high/high to low/low or low/low to high/high), an occurrence that happens in a mere fraction of cases. Further, some schemes may set a phase error flag when an input is the same state as its complement for a number of clock cycles (e.g., sixteen consecutive clock cycles). Thus, there may be a delay to detect whether a phase loss exists. Also, this method may use a field programmable gate array, resulting in a high component count and cost. Utilizing firmware may aid in deciphering when phase losses exist; however, when space is a concern, there may not be a viable firmware path in a motor drive. As such, open wire detection may be enabled through hardware.

Accordingly, presently disclosed embodiments are directed to systems and methods for encoder loss detector circuitry. In some embodiments, the encoder loss detector circuitry may be included on an encoder input card installed in a motor drive. The encoder loss detector circuitry may include a broken wire detector, an encoder isolator, and a compensator. It should be noted that the term "compensator" and "low-pass filter" may be used interchangeably herein. The encoder loss detector circuitry enables both single-ended and differential type encoder signals to be detected with simple analog circuitry. One purpose, among others, of the encoder loss detector circuitry is to convert a pulse train into an analog DC signal that can be easily distinguishable in the event of speed change, motor stalling, and/or broken wire. Indeed, in some embodiments, a continuous pulse train may be integrated using the encoder loss detection circuitry to produce a DC voltage with a magnitude proportional to the frequency. The DC signal output from the encoder loss detector circuitry may be sent to a processor or a comparator or some other type of digital logic operator to decipher the state in which the encoder is operating. Utilizing the techniques disclosed herein may provide definitive encoder loss detection that enables distinguishing between normally operating, stalling, and broken wire scenarios using simple circuitry for both single-ended and differential type encoders. Further, utilizing the techniques may result in reduced component count, footprint for an encoder with the same capability, and cost to manufacture.

With the foregoing in mind, FIG. 1 is a schematic diagram of an embodiment of a system 10 including an incremental encoder 12, in accordance with aspects of the present disclosure. The encoder 12 may be a part of or associated with a motor 14, which is a part of a larger machine system 16. The motor 14 will typically include a rotor/stator system 18 to which the encoder 12 is connected. The motor 14 produces rotational motion for a load 20 by rotating a shaft 22. Although the machine system 16 is illustrated as a rotational system, the techniques described herein may be applied to a variety of motion systems, such as linear motors. The load 20 may be any device that can utilize the rotational motion produced by the machine system 16, such as a fan, a pump, a turbine, a compressor, and the like. It should be understood that any of a vast number of driven loads may be coupled to the motor 14. Indeed, in many applications, many such motors 14 may be coupled in a plant, factory, machine system or process, and these may be interconnected via networks for coordination of their operation, and for communicating with more centralized monitoring and control systems.

The rotor/stator system 18 may be connected to the shaft 22 that is further coupled to the load 20. As mentioned, the motor 14 rotates the shaft 22, thereby driving the load 20 into rotation. The motor 14 may be powered and controlled by switchgear/control circuitry 24. The switchgear/control circuitry 24 may include a motor drive and/or switching devices, such as contactors, relays, switches, circuit breakers, and the like. As disclosed herein, the motor drive may include an encoder input card which contains the encoder loss detection circuitry described above. The encoder input card may be mounted internal to the motor drive casing and the installation of the card may not change the overall dimensions of the motor drive.

The switchgear/control circuitry 24 may selectively provide three-phase electric power to the motor from a power source 26. For example, switching devices in the switchgear/control circuitry 24 may close to connect electric power to the motor 14. On the other hand, the switching devices in the switchgear/control circuitry 24 may open to disconnect electric power from the motor 14. In some embodiments, the power source 26 may be an electrical grid. Thus, the switchgear/control circuitry 24 may provide signals to the motor 14 to drive the motor 14 in operation and to adjust a speed of the motor 14. It should be noted that the three-phase implementation described herein is not intended to be limiting, and the invention may be employed on single-phase circuitry, as well as on circuitry designed for other applications.

In some embodiments, the control circuitry included in the switchgear/control circuitry 24 may be remote from the switchgear. In other words, the control circuitry may be communicatively coupled to the switchgear via a network. In some embodiments, the network may utilize various communication protocols such as DeviceNet, Profibus, or Ethernet. The network may also communicatively couple the control circuitry to other parts of the system 10, such as other control circuitry or a human-machine-interface (not depicted). Additionally or alternatively, the control circuitry may be included in the switchgear or directly coupled to the switchgear, for example, via a serial cable.

As shown, the motor 14 includes the encoder 12, which may be an incremental rotary or linear encoder. The incremental encoder 12 may monitor an angular position and/or angular velocity of the shaft 22. Further, the incremental encoder 12 may determine the direction of movement of the shaft 22. As discussed above, the output signals of incremental rotary encoders incorporate two channels (e.g., A and B) to indicate the rotation of the shaft 22, plus an optional zero or index marker pulse channel (e.g., Z). The input channels are measured as pulses per revolution, whereas the Z channel is measured once per revolution. Because the input channels are in quadrature with each other (90 degrees phase shift relative to each other), they may be utilized to determine the direction of the shaft 22. The Z channel may be used to indicate a home position relative to a single revolution of the shaft 22. The encoder 12 may send a signal to a motor drive that is indicative of the position, velocity, or direction of the shaft 22. Subsequently, the motor drive may adjust the power output to the motor 14 (e.g., the frequency of the drive signals) to control its speed and/or modify the direction of the shaft rotation based on the signal from the encoder 12.

The encoder loss detector circuitry, described in detail below, may support encoder input signals that are either single-ended or differential, at 5V or 12V, for example. In other words, the encoder loss detection circuitry may support input signals for phase A, B, and index signal Z in a single-ended type encoder, and the encoder loss detection may support input signals for phase A/A' and B/B' and index signal for Z/Z' in a differential type encoder. If the encoder is single-ended, the complement inputs for each phase (A'/B'/Z') in the encoder loss detector circuitry may be directly wired to a common power supply. Single-ended signals may be more prone to noise than differential signals and, thus, more suitable for using shorter wiring. On the other hand, differential signals may cancel noise by utilizing signal complements and, thus, more suitable for using longer wiring.

Figure 2A:
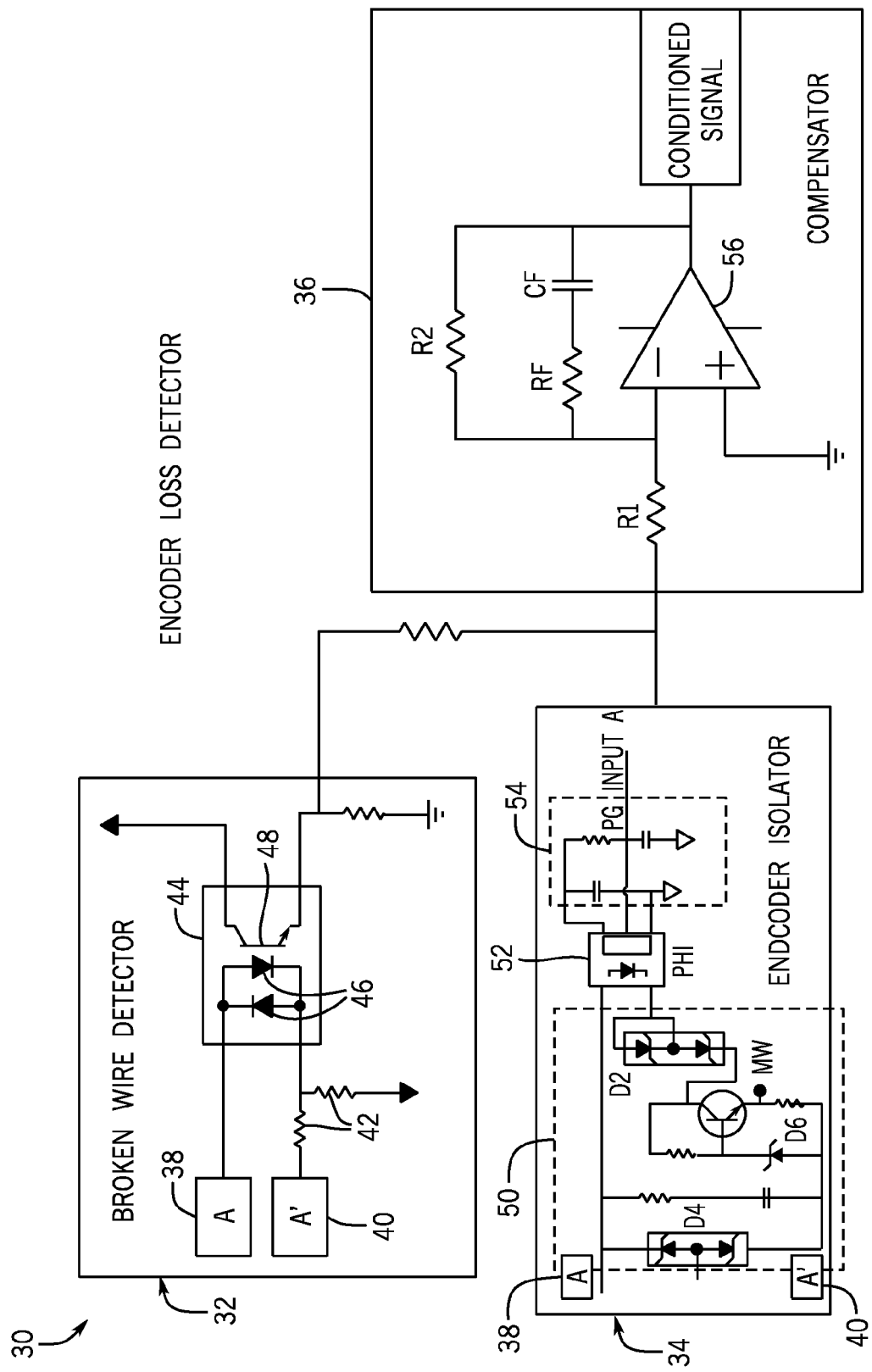

To help describe the encoder loss detector circuitry 30, FIG. 2A is a circuit diagram of its components and FIG. 2B is a truth table of its components output values in different operational scenarios. Beginning first with FIG. 2A, the encoder loss detector circuitry 30 may include a broken wire detector 32, an encoder isolator 34, and a compensator 36 that are electrically coupled together. As depicted, the encoder loss detector circuitry 30 may monitor each input signal separately to determine if a phase loss exists for that particular signal. That is, the encoder loss detector circuitry 30 may be electrically coupled to input signal A/A', to input signal B/B', and to index signal Z/Z' separately. Each input signal (boxes 38 representing A) and its complement (boxes 40 representing A') may be input to both the broken wire detector 32 and the encoder isolator 34 for differential type encoders. As mentioned above, if the encoder is single-ended, the input signal complements (boxes 40) for the broken wire detector 32 and the encoder isolator 34 may be directly wired to a common power supply. The input signals generally consist of a continuous digital pulse train when there is not a phase loss present.

Turning now to the components of the broken wire detector 32, resistors 42 may be utilized to reduce voltage so that current may be flowing through to the bi-directional optocoupler 44. The bi-directional optocoupler 44 may include photodiodes 46 and a phototransistor 48. In a normal scenario, when current is flowing and there is no broken wire, the photodiodes 46 are activated and transfer the electric signal (e.g., AC pulse train signal) as light across a dielectric channel to the phototransistor 48. The phototransistor 48 transforms the light back into an electric signal (e.g., analog DC signal), having either a high (e.g., 1) or a low (e.g., 0) value. In other words, the bi-directional optocoupler 44 may rectify the pulse train received into a DC signal. As a result, the phototransistor 48 may be pulled to a high state when current is flowing and the broken wire detector 32 may output a 1, which may indicate that the input signal being monitored is not open (e.g., broken). However, in a broken wire situation, current may cease flowing between an input signal and its complement (e.g., A and A') and the phototransistor 48 will not be pulled to a high state. As a result, the broken wire detector 32 may output a DC signal with a value of 0. It should be noted that the broken wire may be detected (e.g., 0 output) nearly instantaneously. That is, the techniques disclosed do not require waiting a number of clock cycles before deciding that there is a phase loss (e.g., input signal being monitored is open/broken wire).

Next, the encoder isolator 34 may be utilized for ground isolation and to prevent high voltage from affecting the encoder loss detector circuitry. The components of the encoder isolator 34 may include circuitry for over-volt input protection 50, a unidirectional optocoupler 52, and output filtering 54. During normal operation, when there is not a phase loss or broken wire, a continuous digital AC pulse train may be input to the encoder isolator 34 and pass through the over-volt protection circuitry 50, the unidirectional optocoupler circuitry 52, and the output filtering circuitry 54. More specifically, the over-volt input protection circuitry 50 may include one or more diodes, resistors, capacitors, and/or switches that prevent high voltage from passing through the encoder isolator 34. After the over-volt input protection circuitry 50, the pulse train may pass through the unidirectional optocoupler circuitry 52. The unidirectional optocoupler circuitry 52 may include one or more photodiodes and a phototransistor. Thus, when a pulse train is provided and there is not a broken wire or the motor is not stalling, the unidirectional optocoupler circuitry 52 may output the received pulse train. On the other hand, when there is a broken wire or no current flowing, the unidirectional optocoupler circuitry 52 may output a signal with a low value (e.g., logical 0). When the encoder is in a stalled operating state, the unidirectional optocoupler circuitry 52 may output a signal with a low value (e.g., 0) or a high value (e.g., logical 1). However, prior to being output by the encoder isolator 34, the input signal may pass through the output filtering circuitry 54. The output filtering circuitry 54 may include one or more capacitors and/or resistors to filter out harmonics and provide a clearer signal to be output.

The output signals from both the broken wire detector 32 and the encoder isolator 34 may then be input as an analog DC signal to the compensator 36, or low-pass filter. The compensator 36 may integrate and condition the analog DC signal by dampening it to make it stable before being output. The components of the compensator 36 may include one or more resistors and/or capacitors used to dampen the signal and an operational amplifier 56 used to reduce the amplitude of the DC signal (e.g., attenuate) to make it smoother. The resulting conditioned analog DC signal enables definitively determining the operating mode of the encoder. Indeed, the output conditioned analog DC signal may have a magnitude proportional to the frequency. The compensator 36 may have closed loop control characteristics determined by the range of the encoder speed and the required response time.

To illustrate, FIG. 2B describes a truth table of the output values from each of the broken wire detector 32, the encoder isolator 34, and the compensator 36 included in the encoder loss detector circuitry 30. For example, during normal operation 58, current is flowing through both the broken wire detector 32 and the encoder isolator 34. As such, the broken wire detector 32 may output a logical 1 output and the encoder isolator 34 may output a pulse. These outputs may be combined as an analog DC signal to the compensator 36 that may produce an integrated and conditioned analog DC signal with a value and attenuated ripple. Indeed, as described above, the DC value and ripple amplitude is proportional to the frequency. That is, the ripple will be of lower amplitude and higher frequency the faster the motor is running, and the ripple will be of greater amplitude and of lower frequency the slower the motor is running.

If the motor is stalling 60, the broken wire detector 32 may output a logical 1 output because current is still flowing and there is not an open wire. The encoder isolator 34 may output a logical 1 or 0, instead of the pulse as during normal operation 58, due to the fact that the signal is either stalled in a high or a low state. These outputs may be input to the compensator 36 as an analog DC signal, which may output an integrated and conditioned analog DC signal with a fixed non-zero value.

Additionally, in the broken wire scenario 62, the broken wire detector 32 may output a logical 0 and the encoder isolator 34 may also output a logical 0. The combined outputs may be input to the compensator 36 as a DC signal, which may integrate and condition the signal and produce an analog DC signal with a logical 0 value. As may be seen, the different DC values enable definitively determining whether the encoder is operating normally, stalling, or if there is a broken wire. Thus, to decipher the operational mode of the encoder, the output analog DC signal from the compensator 36 may be sent to a processor or comparator or other type of digital logic operator.

For example, in one embodiment, FIG. 3A depicts the encoder loss detector circuitry 30 being implemented in a scenario where the drive has little processing power and very little space available for additional components. This embodiment may only provide detecting broken wires. As such, the embodiment includes the encoder loss detector circuitry 30 electrically coupled to each input signal (e.g., A, B) and index signal Z and further electrically coupled to zero comparators 70. The zero comparators 70 may determine whether the value of the DC signal received from the encoder loss detector circuitry 30 is a 0 or not. In normal operation, the DC value will not be a logical 0 and so the zero comparator may output a logical 0 output. However, when a broken wire is present, the encoder loss detector circuitry 30 may send a DC signal with logical 0 value to the zero comparator 70 and the zero comparator may output a logical 1 output.

The output from the zero comparators for all three signals (e.g., A, B, Z) may be input to a NOR gate 72. The NOR gate will only output a 1 or true if all three inputs from the zero comparators are a logical 0 (e.g., there is not a broken wire). Thus, if any one of the zero comparators inputs a logical 1 to the NOR gate 72, because there is a broken wire detected and the zero comparator received a logical 0 from one of the encoder loss detector circuitries 30, the NOR gate 72 will output a logical 0. The NOR gate 72 outputs a single signal to a processor 74, such as a microcontroller unit (MCU), which will determine whether there is a broken wire scenario based on the input from the NOR gate 72. More specifically, if the processor 74 receives a logical 1 from the NOR gate, there is not a broken wire, and if the processor 74 receives a logical 0 from the NOR gate 72, there is a broken wire. If a broken wire is detected, the processor 74 may set an alert or communicate this information to a connected system and/or device so that a user may become aware of the situation.

In an alternative embodiment, FIG. 3B describes a configuration where more processing power is available and there is more space available for additional components. As with the previous embodiment, the encoder loss detector circuitry 30 may be electrically coupled to each input signal (e.g., A, B) and index signal (e.g., Z) to detect whether there is a broken wire, stalling, or the speed is changing for each signal. However, in this embodiment, the encoder loss detector circuitry 30 may output the conditioned analog DC signal to an analog-to-digital converter (A/D) 76 that interfaces with a processor 74, such as a microcontroller unit. Therefore, this embodiment may be able to decipher the varying signals received from encoder loss detector circuitry 30 by converting the analog DC signal to a digital signal that can be analyzed by the processor 74. For example, during normal operation, the analog signal input to the A/D may have a DC value and an attenuated ripple. The A/D may convert the analog signal to a digital signal and the processor 74 may determine that the motor is changing speeds based on the ripple. Also, if the motor is stalling, the analog signal input to the A/D may have a fixed DC value that the processor 74 may decipher as the motor stalling after the A/D converts the signal to digital form. Further, if there is a broken wire detected, the analog signal input to the A/D may have a 0 value that the processor 74 may decipher as an open wire after the A/D converts the signal to digital form.

Figure 4A:
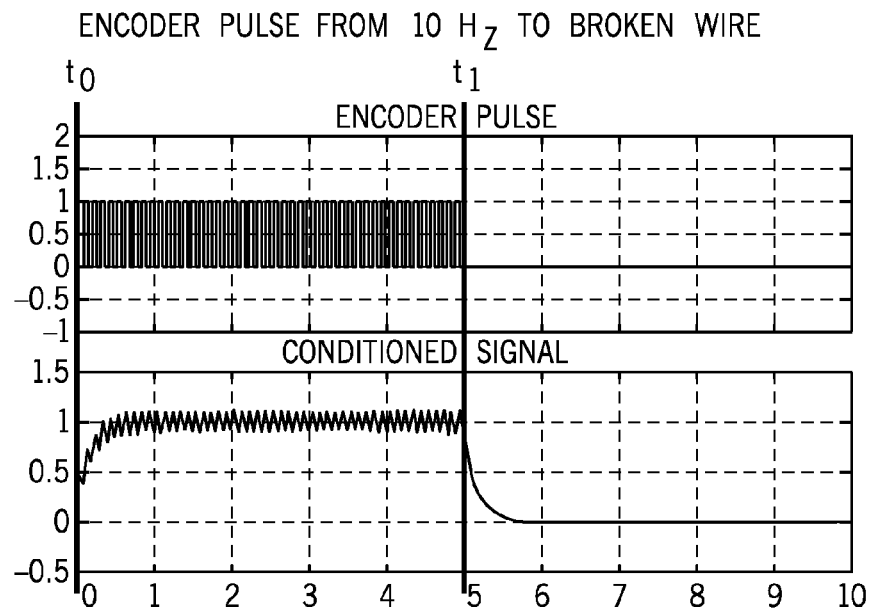
FIG. 4A-4D is a set of simulations showing exemplary pulse train signals generated by an encoder and the associated resulting conditioned signal output by the encoder loss detector, in accordance with aspects of the present disclosure.

To illustrate how the signal output by the encoder loss detector circuitry 30 might occur, FIG. 4A-4D provides a set of pulse train signals generated by an encoder and the associated resulting conditioned analog DC signal output by the encoder loss detector circuitry 30. It should be understood that these exemplary signal diagrams represent the output from an encoder that includes input signals A and B and index signal Z. As seen in FIG. 4A, the encoder pulse and conditioned signal generated reflect a 10 Hz frequency from t0 to t1 and, at t1, a broken wire occurs. During normal operation from t0 to t1, the conditioned analog DC signal output by the encoder loss detector circuitry 30 has a DC value with an attenuated ripple. At t1, however, the broken wire causes the conditioned analog DC signal output by the encoder loss detector circuitry 30 to have a logical value of 0. Thus, a processor analyzing this conditioned signal may determine that a broken wire occurred at t1 for the input or index signal being monitored.

Figure 4B:
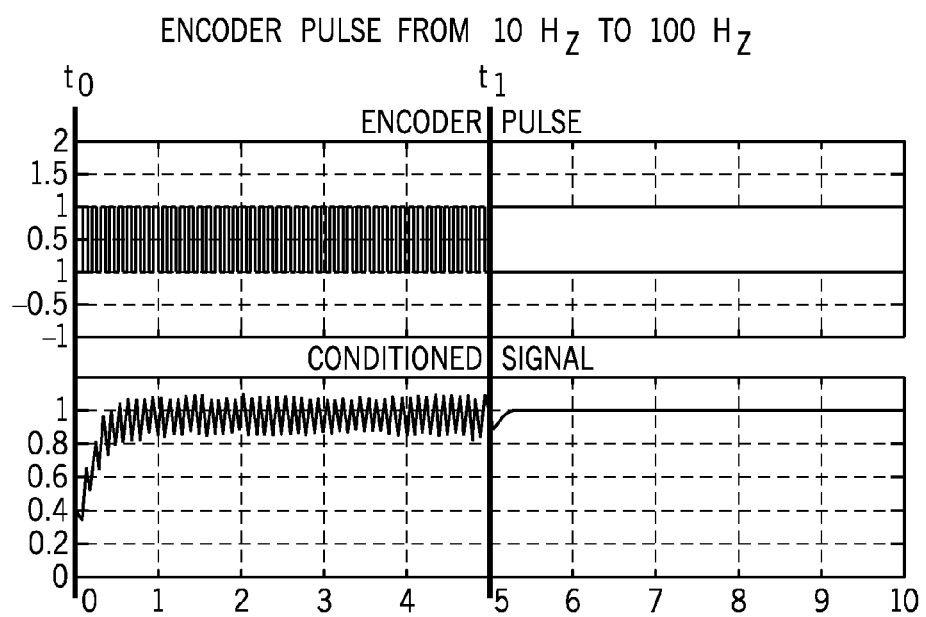

FIG. 4B describes a scenario where the encoder pulse and conditioned signal represent a frequency of 10 Hz from t0 to t1 and, at t1, the frequency increases to 100 Hz (e.g., speed increases). As depicted, the pulse train from t0 to t1 generated by the encoder includes relatively long gaps between pulses at 10 Hz. Likewise, the conditioned analog DC signal output by the encoder loss detector circuitry 30 from t0 to t1 has a DC value with high attenuated ripples and gaps between each ripple. However, when the speed increases to 100 Hz, the encoder pulses occur so quickly that the pulse train almost appears to be a solid bar. Likewise, the conditioned analog DC signal flattens and the ripples are of low amplitude so that the signal appears as nearly a straight line. Thus, a processor analyzing the conditioned signal may determine that the speed is increasing during normal operation if it received this conditioned signal. Indeed, the processor may be able to determine the exact frequencies that the signal represents.

Figure 4C:
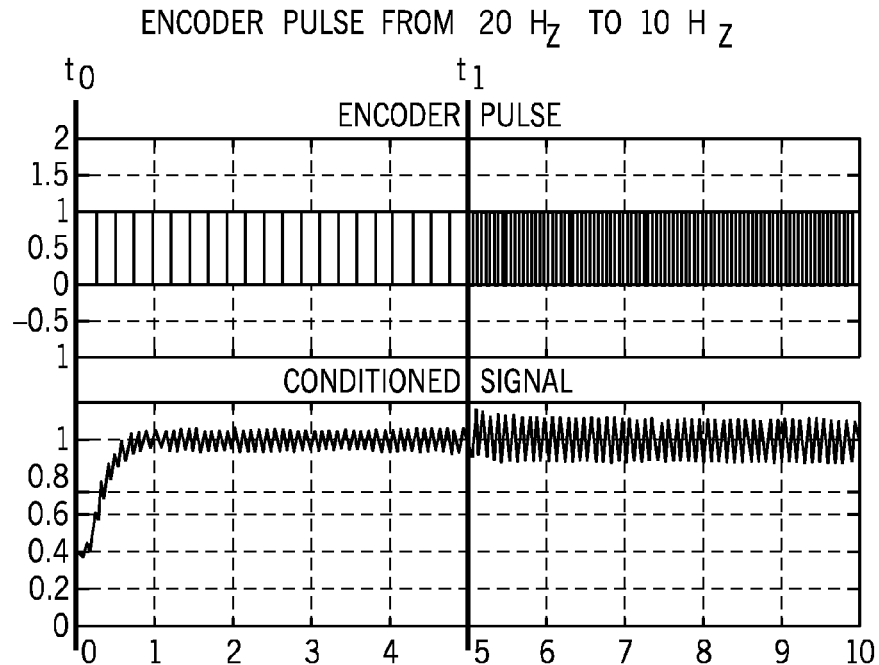

On the other hand, FIG. 4C illustrates a scenario where the encoder pulse and conditioned signal represent a frequency of 20 Hz from t0 to t1 and, at t1, the frequency decreases to 10 Hz (e.g., speed decreases). As depicted, the pulse train from t0 to t1 generated by the encoder includes relatively short gaps between pulses at 20 Hz. Likewise, the conditioned analog DC signal output by the encoder loss detector circuitry 30 from t0 to t1 has a DC value with small attenuated ripples and gaps between each ripple. However, when the speed decreases to 10 Hz, the encoder pulses slow and the gaps between the pulses become longer. Likewise, the conditioned analog DC signal ripples become of greater amplitude and lower frequency. Thus, a processor analyzing the conditioned signal may determine that the speed is decreasing during normal operation if it received this conditioned signal. Indeed, the processor may be able to determine the exact frequencies that the signal represents. In this way, the conditioned DC signal output by the encoder loss detector circuitry 30 enables detecting speed changes.

Figure 4D:
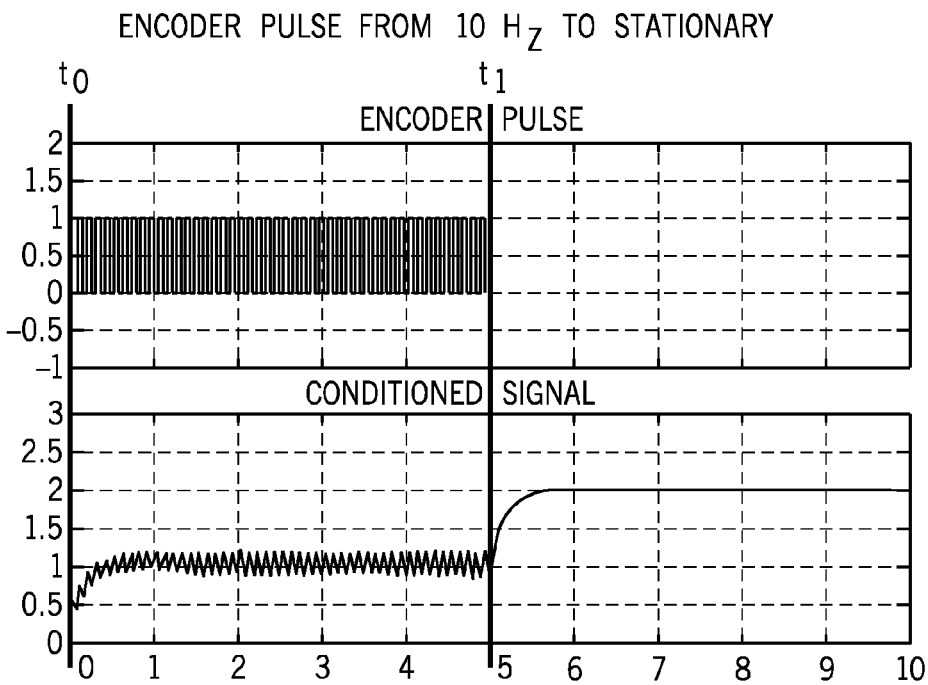

FIG. 4D describes a scenario where the encoder pulse and conditioned signal represent a frequency of 10 Hz from t0 to t1 and, at t1, the encoder stalls. As depicted, the pulse train from t0 to t1 generated by the encoder includes relatively long gaps and spaces between the pulses. Likewise, the conditioned analog DC signal output by the encoder loss detector circuitry 30 from t0 to t1 has a DC value with high ripples that are spread out. However, at t1, when the encoder stalls, the encoder pulses stop and the conditioned signal output by the encoder loss detector circuitry 30 has a fixed non-zero DC value. Thus, a processor analyzing the conditioned signal may determine that the encoder began stalling at t1.

As may be appreciated, the analog DC signal output by the encoder loss detector circuitry 30 may enable a processor or comparator or other digital logic operator to quickly and definitively determine the state or mode in which the encoder is operating. Indeed, the techniques described herein do not require waiting a number of clock cycles before making a decision as the analog DC signal is easily distinguishable in the different scenarios almost instantaneously where only the time constant limits the decision latency.

Figure 5:
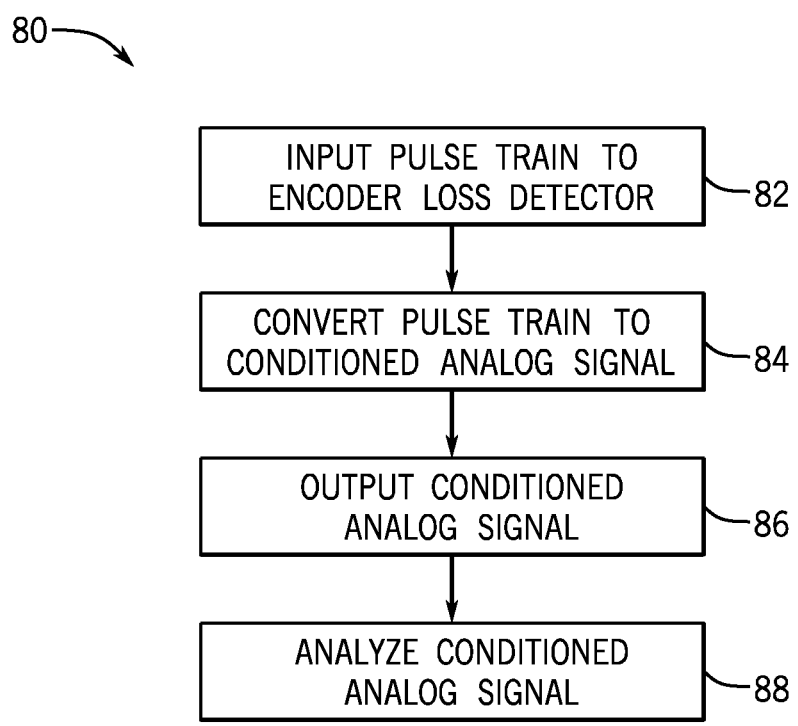
FIG. 5 illustrates an exemplary process for utilizing the encoder loss detector to determine the mode in which the encoder is operating, in accordance with aspects of the present disclosure.

A process 80 for utilizing the encoder loss detector circuitry 30 to determine the mode in which the encoder is operating is depicted in FIG. 5. The process 80 may include inputting a pulse train to the encoder loss detector circuitry 30 (process block 82), converting the pulse train to a conditioned analog DC signal (process block 84), outputting the conditioned analog DC signal (process block 86), and analyzing the conditioned analog DC signal (process block 88). As previously discussed, the encoder loss detector circuitry 30 may be electrically coupled to each input signal (e.g., A, B) and the index signal Z. Additionally, either a single-ended or differential line driver type encoders can use this detection scheme. The pulse train may be input to both the broken wire detector 32 and the encoder isolator 34. Then, in process block 84, the pulse train may be converted from an AC signal to a DC signal and input to the compensator 36. The compensator may integrate and condition the DC signal by dampening it into a stable DC signal. Next, in process block 86, the compensator 36 may output the conditioned analog DC signal to a processor 74, comparator or other digital logic operator, or the like, which may analyze the conditioned analog DC signal to determine the encoder's operating mode (process block 88). In the embodiment that includes an analog-to-digital converter (A/D), the analog signal may be converted to a digital signal and analyzed by the processor to determine whether there is a broken wire, the motor is stalling, or the motor is changing speeds. In the embodiment that includes the zero comparator, the processor may determine whether a broken wire condition exists based on the signal from the NOR gate.

While only certain features of the present disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A system, comprising:
    broken wire detector circuitry comprising an optocoupler;
    encoder isolator circuitry comprising input voltage protection circuitry, an optocoupler, and output filtering circuitry; and
    compensator circuitry comprising signal conditioning circuitry; and
    wherein the broken wire detector circuitry and the encoder isolator circuitry are configured to accept inputs signals (A, B) and an index signal (Z) for a single-ended and differential type incremental encoder, the broken wire detector circuitry is configured to convert an input AC pulse train signal to an analog DC signal, the encoder isolator is configured to protect from high input voltages, and the compensator is configured to accept outputs of the broken wire detector circuitry and the encoder isolator circuitry and to integrate and dampen the analog DC signal that has a value representative of an operating state of the incremental encoder; and
    wherein the analog DC signal value output by the compensator circuitry represents the operating state of the incremental encoder comprising whether the encoder is changing speeds during normal operation, the encoder is stalling, or if there is a broken wire for any of the three input signals to the encoder; and
    wherein the analog DC signal produced during normal operation has a DC value with an attenuated ripple, the analog DC signal produced during stalling has a fixed non-zero DC value, and the analog DC signal produced by a broken wire has a value of zero.

2. The system of claim 1, wherein each input signal and the index signal for the incremental encoder is electrically coupled to separate broken wire detector circuitries and encoder isolator circuitries, the output from each compensator circuitry is electrically coupled to separate zero comparators, the output from each zero comparator is electrically coupled to a NOR gate, and the output from the NOR gate is electrically coupled to a processor.

3. The system of claim 2, wherein the compensator circuitries output a logical low value when there is a broken wire detected and a logical high value when there is not a broken wire detected to each electrically coupled zero comparator, wherein each zero comparator outputs a high value when a broken wire is detected and a low value when a broken wire is not detected to the electrically coupled NOR gate, wherein the NOR gate outputs a high value when all three inputs from the electrically coupled zero comparators indicate a broken wire is not detected and outputs a low value when any of the three inputs from the electrically coupled zero comparators indicate a broken wire is detected.

4. The system of claim 1, wherein each input signal and the index signal for the encoder is electrically coupled to separate broken wire detector circuitries and encoder isolator circuitries and the output from each compensator circuitries is electrically coupled to an analog-to-digital converter that is further electrically coupled to a processor.

5. The system of claim 4, wherein the operating state comprises normal operation, changing speeds, stalling, or broken wire and the processor is configured to determine which state is represented by the digitally converted signal.

6. The system of claim 1, wherein the analog DC signal has a voltage with a magnitude that reflects speed.

7. The system of claim 1, wherein the broken wire detector circuitry, the encoder isolator circuitry, and the compensator circuitry are disposed on an encoder input card installed in a motor drive.

8. A system, comprising:
encoder loss detector circuitry comprising a broken wire detector, an encoder isolator, and a compensator; and
wherein output signals from the broken wire detector and the encoder isolator are input to the compensator, the broken wire detector is configured to detect when there is a broken wire and convert an input pulse train signal to an analog DC signal with a value representative of the broken wire, the encoder isolator is configured to protect from high input voltages and output a value representative of an operating state of an encoder, and the compensator is configured to integrate and dampen the analog DC signal and output the dampened analog DC signal with a value representative of an operating state of the encoder, and
wherein the analog DC signal has a DC value and attenuated ripple during normal operation, the analog DC signal has a fixed non-zero DC value during a stalling state, and the analog DC signal has a value of zero during a broken wire state.

9. The system of claim 8, wherein the operating state of the encoder comprises normal operation, changing speeds, stalling, or broken wire.

10. The system of claim 8, wherein the broken wire detector comprises a bi-directional optocoupler that is configured to convert the pulse train signal into the analog DC signal and output a one when there is not a broken wire and output a zero when there is a broken wire.

11. The system of claim 8, wherein each of an input signal (A, B) and an index signal (Z) for an incremental encoder is electrically coupled to separate encoder loss detector circuitries' broken wire detectors and encoder isolators and the output from each compensator is electrically coupled to a separate zero comparator that is electrically coupled to a NOR gate and the NOR gate is further electrically coupled to a processor.

12. The system of claim 11, wherein the processor is configured to determine whether a broken wire operating state exists by analyzing the signal output by the NOR gate, wherein a logical high value input by the NOR gate to the processor indicates that there is not a broken wire detected and a logical low value input by the NOR gate to the processor indicates that there is a broken wire detected.

13. The system of claim 8, wherein each of an input signal (A, B) and an index signal (Z) for an incremental encoder is electrically coupled to separate encoder loss detector circuitries broken wire detectors and encoder isolators and the output from each compensator is electrically coupled to an analog-to-digital converter that is further electrically coupled to a processor.

14. A method, comprising:
receiving a pulse train signal from an incremental encoder at encoder loss detector circuitry comprising a broken wire detector, an encoder isolator, and a compensator;
protecting, via the encoder isolator, the encoder loss detector circuitry from high input voltage;
converting, via the broken wire detector, the pulse train signal to an analog DC signal;
conditioning, via the compensator, the analog DC signal to be stable;
outputting, via the compensator, the conditioned analog DC signal; and
analyzing the conditioned analog DC signal;
wherein the conditioned analog DC signal has a DC value and attenuated ripple during normal operation, a fixed non-zero DC value a during stalling state, and a DC value of zero during a broken wire state.

15. The method of claim 14, wherein the conditioned analog DC signal has a value representative of an operating state of the incremental encoder comprising normal operation, changing speeds, stalling, or broken wire.

16. The method of claim 14, wherein the pulse train is received by both the broken wire detector, which utilizes a bi-directional optocoupler to detect when a wire is broken and to convert the pulse train into the analog DC signal, and the encoder isolator, and the outputs of the broken wire detector and the encoder isolator are input to the compensator, which is configured to integrate and condition the analog DC signal to be output with a value representative of an operating state of the incremental encoder.

\* \* \* \* \*